US006660646B1

(12) United States Patent
Elmadjian

(10) Patent No.: US 6,660,646 B1
(45) Date of Patent: Dec. 9, 2003

(54) METHOD FOR PLASMA HARDENING PHOTORESIST IN ETCHING OF SEMICONDUCTOR AND SUPERCONDUCTOR FILMS

(75) Inventor: Raffi N. Elmadjian, Arcadia, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 27 days.

(21) Appl. No.: 09/668,250

(22) Filed: Sep. 21, 2000

(51) Int. Cl.$^7$ ............... H01L 21/302; H01L 21/461; H01L 21/31
(52) U.S. Cl. ............... 438/709; 438/710; 438/711; 438/780; 438/389; 438/689; 156/345.1; 156/912; 216/58
(58) Field of Search ............... 738/709–15, 780–81, 738/789–90, 689, 778; 216/58–81; 156/345.1, 912–13

(56) References Cited

U.S. PATENT DOCUMENTS

| 4,529,621 A | * | 7/1985 | Ballard ............... 427/95 |
| 4,532,005 A | * | 7/1985 | Grieco et al. ............... 156/661.1 |
| 4,873,176 A | * | 10/1989 | Fisher ............... 430/313 |
| 4,904,866 A | * | 2/1990 | Collins et al. ............... 250/492.2 |
| 5,037,506 A | * | 8/1991 | Gupta et al. ............... 156/646 |
| 5,215,867 A | * | 6/1993 | Stillwagon et al. ............... 430/323 |
| 5,407,787 A | * | 4/1995 | Mcelhanon et al. ............... 430/315 |
| 5,698,901 A | * | 12/1997 | Endo ............... 257/758 |
| 5,876,897 A | * | 3/1999 | Durham et al. ............... 430/170 |
| 5,926,689 A | * | 7/1999 | Cote et al. ............... 438/10 |
| 5,928,791 A | * | 7/1999 | Rosenmayer ............... 428/421 |
| 6,033,979 A | * | 3/2000 | Endo ............... 438/622 |
| 6,034,752 A | * | 3/2000 | Khan et al. ............... 349/74 |
| 6,071,670 A | * | 6/2000 | Ushirogouchi et al. ............... 430/270.1 |
| 6,121,154 A | * | 9/2000 | Haselden et al. ............... 438/724 |
| 6,136,676 A | * | 10/2000 | Saito ............... 438/587 |
| 6,183,940 B1 | * | 2/2001 | Wang et al. ............... 430/328 |
| 6,184,148 B1 | * | 2/2001 | Nakamura ............... 438/715 |
| 6,207,343 B1 | * | 3/2001 | Fujimori et al. ............... 430/270.1 |
| 6,429,916 B1 | * | 8/2002 | Nakata et al. ............... 349/106 |
| 2002/0106908 A1 | * | 8/2002 | Cohen et al. ............... 438/789 |

FOREIGN PATENT DOCUMENTS

| EP | 0385590 | * | 5/1990 | ............ C23F/4/00 |
| EP | 0431971 A2 | * | 9/1990 | ............ G03F/7/075 |
| EP | 1061156 A2 | * | 6/1999 | ............ C23C/16/56 |

OTHER PUBLICATIONS

IBM Technical disclosure bulletin, US tbd–acc–no: nn81034447 "Hot plate heating of photoresist" Mar. 1981.*
Moran et al. "Plasma pretreatment to improve resist properties by reduction of resist flow during postbake" J. Vac. Sci Technology vol. 19 no. 4 11/12 1981. pg. 1127–31.*
Nam et al. "Analysis of sidewall films formed during Si etching with photoresist and nitride mask" IEEE 0–7803–5727–2/99 St2–03 pp. 151–154.*

* cited by examiner

*Primary Examiner*—Matthew Smith
*Assistant Examiner*—Granvill D Lee, Jr.
(74) *Attorney, Agent, or Firm*—Harness, Dickey & Pierce, P.L.C.

(57) ABSTRACT

A plasma photoresist hardening technique is provided to improve the etch resistance of a photoresist mask 26. The technique involves the formation of a thin passivation layer 26b on the photoresist mask 26 which substantially slows down the etching rate of the photoresist material 26a. Advantageously, this technique allows preservation of critical dimension features such as via hole openings and transmission lines. The technique hardens the surface of the photoresist film 26 by both chemically and physically bonding halogenated hydrocarbons with cross linked photoresist polymer. This results in a passivation layer 26b which is highly resistant to harsh plasma etch environments.

18 Claims, 1 Drawing Sheet

# METHOD FOR PLASMA HARDENING PHOTORESIST IN ETCHING OF SEMICONDUCTOR AND SUPERCONDUCTOR FILMS

BACKGROUND OF THE INVENTION

1. Technical Field

The present invention generally relates to etching techniques and, more particularly, to a method for improving the etching resistance of photoresist masks.

2. Discussion

Photoresist masks are used during etching processes to enable the formation of small features such as via holes in the underlying material. As microelectronic devices have increased in complexity, feature sizes have become smaller and smaller. Using present techniques, high aspect ratio features are relatively difficult to etch using plasma dry etching and/or wet chemical etching processes.

With respect to plasma dry etching, the photoresist erodes so that mask features, such as via hole openings, increase in size. Additionally, line widths shrink in size. During wet chemical etching, the photoresist undercuts, causing distorted circuit features. In high density circuitry (e.g., VLSI or ULSI) these changes in feature size make it more difficult to predict actual circuit performance with over-etched transmission line widths.

An additional problem with densely packed circuit layouts is that overetching of closely spaced via hole openings causes the via hole openings to overlap with each other. This results in circuit reliability problems. Such circuit reliability problems include changes in inductance due to intersecting via holes.

In an effort to overcome the foregoing problems, techniques such as hard baking photo resists in a convection oven or on a hot plate and deep ultra violet curing have been employed. Unfortunately, these techniques have not provided sufficient deterrents to the above problems. For example, conventional hard baking and deep ultraviolet hardening methods simply cross-link the photoresist polymer which does not make the photoresist highly resistant to subsequent harsh plasma etch environments. The deep ultraviolet method also requires special equipment which adds cost to processing. The ultraviolet method may also present ultraviolet radiation hazard to the process work environment.

In view of the foregoing, a new technique for improving etch processing is needed.

SUMMARY OF THE INVENTION

A plasma photoresist hardening technique is provided to improve the etch resistance of a photoresist mask. The technique involves the formation of a thin passivation layer on the photoresist mask which substantially slows down the etching rate of the photoresist material. Advantageously, this technique allows preservation of critical dimension features such as via hole openings and transmission lines. In one embodiment of the present invention, the technique hardens the surface of the photoresist film by both chemically and physically bonding halogenated hydrocarbons with cross-linked photoresist polymer. This results in a passivation layer which is highly resistant to harsh plasma etch environments.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

The present invention is directed toward a method of improving the etching resistance of photoresist masks. In accordance with the teachings of the present invention, a passivation layer is formed on the photoresist which is highly resistant to harsh plasma etch environments. Advantageously, the method improves wafer processing by allowing smaller via hole openings and narrower transmission lines to be etched. This allows the via holes and/or transmission lines to be spaced closer together on a wafer mask. The smaller spacing allows more complex circuits to be integrated onto smaller wafer areas thereby enabling densely packed circuit layouts. Also, the method of the present invention can be conveniently performed in the same plasma etch chamber that is used to etch the semiconductor material.

Figure 1:
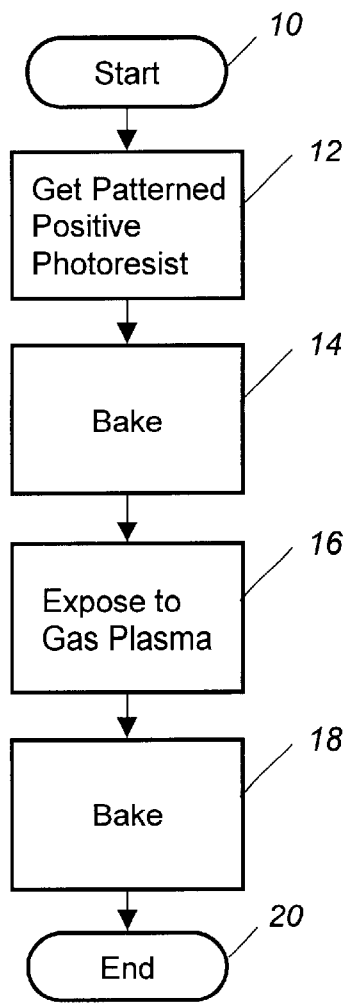
FIG. 1 is a flowchart depicting the methodology of the present invention.

Turning now to FIG. 1, a method for plasma hardening a photoresist mask in accordance with the teachings of the present invention will be described. The methodology starts at bubble 10 and continues to block 12. In block 12 a patterned positive photoresist is obtained. The photoresist may include, for example, R—$C_xH_yO_z$—R. From block 12, the methodology continues to block 14.

In block 14, the patterned positive photoresist is baked at an elevated temperature. The baking temperature is preferably between about 100 and 200° C. and is performed in a convection oven or on a hot plate. This baking physically hardens the photoresist by cross-linking the polymer. From block 14 the methodology continues to block 16.

In block 16, the surface of the cross-linked photoresist is exposed to a gas plasma. The gas plasma preferably includes $C_xH_yF_zCl_w$ and Oxygen (O2), where x, y, z and w may range from about 0 to 40, and more preferably from about 0 to 25. The gas exposure preferably takes place in a reactive-ion-etcher or plasma chamber system and at an RF power of about 50 to 1500 watts and more preferably of about 50 to 1000 watts. Examples of suitable plasma chamber systems besides reactive-ion-etcher include barrel, downstream, hexode, ICP, ECR, Merie, and TCP types.

During exposure to the gas plasma, the $C_xH_yF_zCl_w$ and Oxygen are disassociated into various species including reactive positive and negative ions, radicals and neutrals. These species bombard the photoresist and then absorb/diffuse into the surface of the photoresist. The species then both chemically react and physically bond to form halogenated monolayer(s) or films (containing fluorine/chlorine atoms or molecules) ranging from about 200 Å to about 500 Å in thickness. From block 16 the method continues to block 18.

In block 18, the photoresist with the "plasma-hardened" surface from block 16 is immediately baked at an elevated temperature. The baking temperature is preferably between about 100 and 200° C. and is performed in a convection oven or on a hot plate. The baking step subsequent to the gas plasma exposure step at block 16 reinforces the physical and/or chemical bonding between the thin passivating layer and the surface of the cross-linked photoresist.

From block 18, the methodology advances to bubble 20 and ends.

Figure 2:
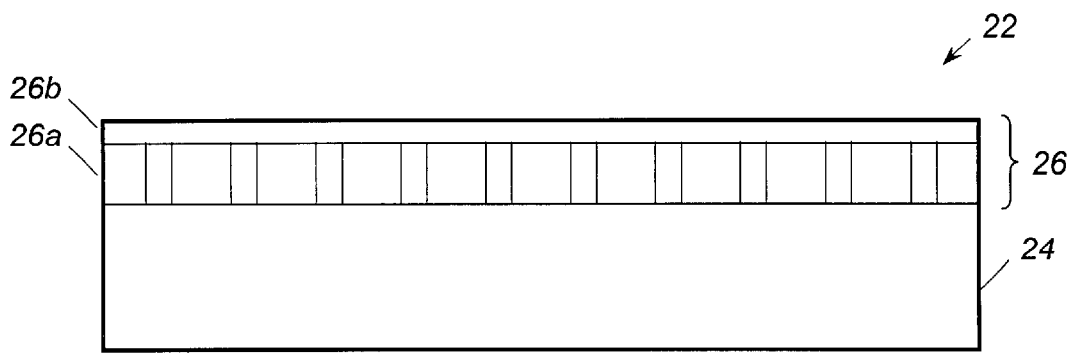
FIG. 2 is a schematic side view of a wafer made in accordance with the present invention.

Turning now to FIG. 2, an apparatus formed in accordance with the above method is illustrated generally at 22. The apparatus 22 includes a wafer 24 having a positive patterned photoresist 26 formed thereon which includes photoresist material 26A and a passivating layer 26B. The passivating layer 26B is formed using the above-described method.

The passivating layer 26B of the photoresist 26 inhibits aggressive chemical or physical reactions in plasma etched environments using conventional gasses for etching semiconductor or superconductor films. Consequently, etch selectivity of the photoresist 26 to the material being etched is substantially improved and, as a result, feature critical dimensions are preserved/controlled from mask to afteretch. This substantially improves device performance, yield, and reliability.

Although the present invention will find usefulness in many applications requiring small dimension circuit features, such as high aspect ratio via holes and transmission lines, it may be particularly well suited for micro-electronic chip fabrication in both semiconductor and superconductor materials such as silicon, gallium arsenide, indium phosphide, niobium, niobium nitride, silicon, germanium, gallium nitride, and indium aluminum arsenide. Such materials are commonly employed in advanced wafer processing/fabrication.

What is claimed is:

1. A method of treating a photoresist for enhanced etching resistance comprising the steps of:

baking said photoresist;

forming a passivation layer on said baked photoresist by exposing said baked photoresist to a gas plasma, the gas plasma being comprised of $C_xH_yF_zCl_w$ and $O_2$; and re-baking said exposed photoresist.

2. The method of claim 1 wherein said baking step further comprises baking at a temperature of about 100 to about 200° C.

3. The method of claim 2 wherein said baking step further comprises baking using one of a convection oven and a hot plate.

4. The method of claim 1 wherein x, y, z, and w are between about 0 and about 40.

5. The method of claim 4 wherein x, y, z, and w are between about 0 and about 25.

6. The method of claim 1 wherein said exposing step further comprises exposing at an RF power of about 50 to about 1500 watts.

7. The method of claim 6 wherein said exposing step further comprises exposing at an RF power of about 50 to about 1000 watts.

8. The method of claim 1 wherein said exposing step further comprises exposing in one of a reactive-ion-etcher and a plasma chamber.

9. A method of treating a photoresist for enhanced etching resistance comprising the steps of:

baking said photoresist;

forming a passivation layer on said baked photoresist by exposing said baked photoresist to a gas plasma; and re-baking said exposed photoresist at a temperature of about 100 to about 200° C.

10. The method of claim 9 wherein said baking step further comprises baking using one of a convection oven and a hot plate.

11. A method of treating a photoresist for enhanced etching resistance comprising the steps of:

cross-linking a polymer of said photoresist;

disassociating a gas plasma containing $C_xH_yF_zCl_w$ and Oxygen into a plurality of species including reactive positive and negative ions, radicals and neutrals; and bombarding said cross-linked polymer of said photoresist with said species such that said species are at least one of absorbed and diffused into said cross-linked polymer of said photoresist.

12. The method of claim 11 wherein said bombarding step further comprises the step of chemically reacting and physically bonding said species and said cross-linked polymer of said photoresist to form halogenated monolayers on a remainder of said photoresist.

13. The method of claim 12 wherein said halogenated monolayers contain at least one of fluorine and chlorine.

14. The method of claim 12 wherein said monolayers are between about 200 and about 500 Å thick.

15. The method of claim 11 further comprising the step of baking said bombarded photoresist after said bombarding step.

16. A method of treating a photoresist for enhanced etching resistance comprising the steps of:

chemically and physically bonding halogenated hydrocarbons with a cross-linked polymer of said photoresist to form a passivation layer on said photoresist.

17. The method of claim 16 further comprising the step of baking said passivation layer and said photoresist after said bonding step to enhance a bond therebetween.

18. The method of claim 16 wherein said halogenated hydrocarbons originate in a plasma gas including $C_xH_yF_zCl_w$ and Oxygen.

* * * * *